(12) United States Patent
Lee et al.

(10) Patent No.: US 10,651,360 B2
(45) Date of Patent: May 12, 2020

(54) THERMOELECTRIC MATERIAL, THERMOELECTRIC MODULE AND THERMOELECTRIC DEVICE INCLUDING THE SAME

(71) Applicant: Kookmin University Industry Academy Cooperation Foundation, Seoul (KR)

(72) Inventors: Hyun Jung Lee, Seoul (KR); Soo Hyun Kim, Incheon (KR); Yong Myeong Kim, Daegu (KR); Hyun Woo Bark, Seoul (KR)

(73) Assignee: Kookmin University Industry Academy Cooperation Foundation, Seoul (KR)

( * ) Notice: Subject to any disclaimer, the term of this patent is extended or adjusted under 35 U.S.C. 154(b) by 0 days.

(21) Appl. No.: 15/974,980

(22) Filed: May 9, 2018

(65) Prior Publication Data

US 2018/0269372 A1    Sep. 20, 2018

Related U.S. Application Data

(63) Continuation of application No. PCT/KR2016/012164, filed on Oct. 27, 2016.

(30) Foreign Application Priority Data

Nov. 9, 2015 (KR) .......................... 10-2015-0156744
Apr. 5, 2016 (KR) .......................... 10-2016-0041724
Apr. 5, 2016 (KR) .......................... 10-2016-0041736

(51) Int. Cl.
*H01L 35/34* (2006.01)
*H01L 35/24* (2006.01)
(Continued)

(52) U.S. Cl.
CPC ................ *H01L 35/34* (2013.01); *C08J 5/18* (2013.01); *C08L 79/08* (2013.01); *H01L 35/14* (2013.01);
(Continued)

(58) Field of Classification Search
CPC ......... H01L 35/34; H01L 35/14; H01L 35/24; C08J 5/18; C08L 79/08
See application file for complete search history.

(56) References Cited

U.S. PATENT DOCUMENTS

2009/0199887 A1    8/2009   Johnson et al. .............. 136/239
2012/0018682 A1    1/2012   Minami et al. ............... 252/514
(Continued)

FOREIGN PATENT DOCUMENTS

KR    10-2013-0137253    12/2013

OTHER PUBLICATIONS

Yu et al., Thermoelectric Behavior of Segrgated-Network Polymer Nanocomposites, Nano Letters, vol. 8, No. 12, pp. 4428-4432 (Year: 2008).*

(Continued)

*Primary Examiner* — Jayne L Mershon
(74) *Attorney, Agent, or Firm* — Harrington & Smith

(57) ABSTRACT

A method of preparing the thermoelectric materials includes coating a thin film of a material having a Seebeck coefficient of $\pm\mu V/K$ or greater on one surface of a substrate, coating a polymer precursor solution for forming a polymer having a glass transition temperature (Tg) of about 50° C. or greater on a top surface of the material thin film, forming a polymer layer on the top surface of the material thin film by curing the polymer precursor solution, and preparing the self-standing flexible thermoelectric composite structure by separating the polymer layer formed on the top surface of the material thin film from the substrate.

17 Claims, 15 Drawing Sheets

(51) Int. Cl.
  *H01L 35/14* (2006.01)
  *C08L 79/08* (2006.01)
  *C08J 5/18* (2006.01)
  *C08L 23/08* (2006.01)
  *C08L 25/08* (2006.01)
  *C08L 27/06* (2006.01)

(52) U.S. Cl.
  CPC .......... *H01L 35/24* (2013.01); *C08L 23/0846* (2013.01); *C08L 25/08* (2013.01); *C08L 27/06* (2013.01)

(56) References Cited

U.S. PATENT DOCUMENTS

| | | | |
|---|---|---|---|
| 2014/0230868 A1 | 8/2014 | Ryu et al. | 136/200 |
| 2014/0345661 A1 | 11/2014 | Roy et al. | 136/201 |
| 2015/0013741 A1 | 1/2015 | Mutou et al. | 136/238 |
| 2016/0104554 A1* | 4/2016 | Zhong | B29C 41/12 |
| | | | 264/425 |

OTHER PUBLICATIONS

Kunadian et al., Thermoelectric power generation using doped MWCNTs, Carbon, vol./Issue 47, pp. 589-601 (Year: 2009).*

Slobodian et al., Thermoelectric properties of Carbon Nanotube and nanofiber based ethylene octene copolymer devices for Thermoelectric devices, Journal of Nanomaterials, vol. 2013, pp. 1-7 (Year: 2013).*

Duan et al., Effects of nitrogen-, boron-, and phosphorous-, doing or co-doping on metal-free catalysis, Catalysis Today, vol./issue 249, pp. 184-191 (Year: 2015).*

* cited by examiner

THERMOELECTRIC MATERIAL, THERMOELECTRIC MODULE AND THERMOELECTRIC DEVICE INCLUDING THE SAME

CROSS-REFERENCE TO RELATED APPLICATION

This patent application is a continuation of International Patent Application Number PCT/KR2016/012164 filed Oct. 27, 2016 which is hereby incorporated by reference in its entirety.

TECHNICAL FIELD

One or more embodiments relate to thermoelectric materials, thermoelectric modules and thermoelectric devices including the same, and methods of preparing the thermoelectric materials.

BACKGROUND ART

Research has been focused on high efficiency thermoelectric materials in the field of thermoelectric technology. Properties of thermoelectric materials are defined as a dimensionless figure of merit (ZT).

$$ZT = \frac{S^2 \sigma T}{k} \qquad \text{Equation 1}$$

In Equation 1, S represents Seebeck coefficient, a represents electrical conductivity, κ represents thermal conductivity, and T represents absolute temperature.

As the Seebeck coefficient and electrical conductivity increase and the thermal conductivity decreases, the ZT increases. The thermal conductivity is defined as a sum of a thermal conductivity obtained from electron transfer according to the Wiedemann-Franz law and a thermal conductivity obtained from lattice vibration of a material.

Si-Te-based thermoelectric materials having excellent thermoelectric properties at a temperature of 300° C. or less have not been widely used due to high manufacturing costs, high brittleness, high density, and difficulty in shaping. Thus, carbonaceous materials have been used as thermoelectric materials to improve these properties. Although carbon nanotubes and graphene have excellent electrical properties, commercialization thereof is limited due to high manufacturing costs, difficulty in conversion from a p-type thermoelectric material to an n-type thermoelectric material, and high thermal conductivity.

Also, thermoelectric devices including a thermoelectric material using a general inorganic material cannot be applied to various apparatuses due to high density, high weight, and low flexibility.

Thus, there is still a need to develop a thermoelectric material having a structure with improved thermoelectric properties suitable for various apparatuses.

Also, to increase the efficiency of a thermoelectric module for power conversion, various factors such as contact resistance of elements in the thermoelectric module and the number of thermoelectric pairs including n-type and p-type thermoelectric semi-conductors need to be considered.

The ZT may increase as contact resistance decreases and the number of thermoelectric pairs increases, resulting in an increase in efficiency of the thermoelectric module.

In the thermoelectric module, electricity flows from a high-temperature insulating plate to a low-temperature insulating plate via an electrode, the thermoelectric material, and the electrode. Thus, an adhesion process of these elements needs to be performed to reduce electrical resistance to obtain high current density and thermoelectric efficiency of the thermoelectric module.

Therefore, there is still a need to develop methods of preparing thermoelectric materials to increase current density and thermoelectric efficiency of thermoelectric modules.

DISCLOSURE OF INVENTION

Brief Description of Drawings

These and/or other aspects will become apparent and more readily appreciated from the following description of the embodiments, taken in conjunction with the accompanying drawings in which.

BEST MODE FOR CARRYING OUT THE INVENTION

Figure 1:
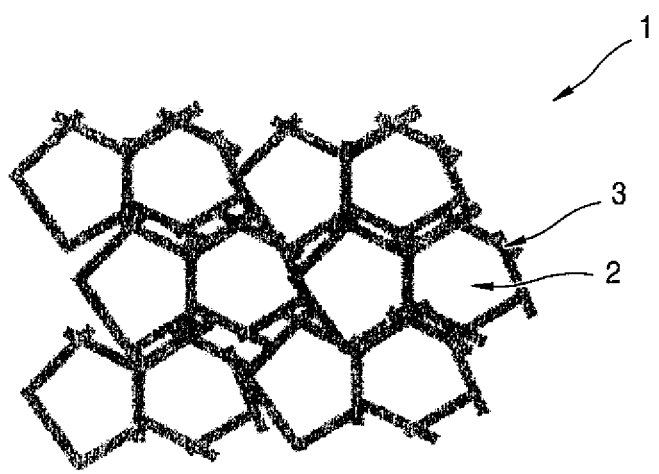
FIG. 1 is a schematic diagram of a thermoelectric material according to an embodiment.
Figure 2:
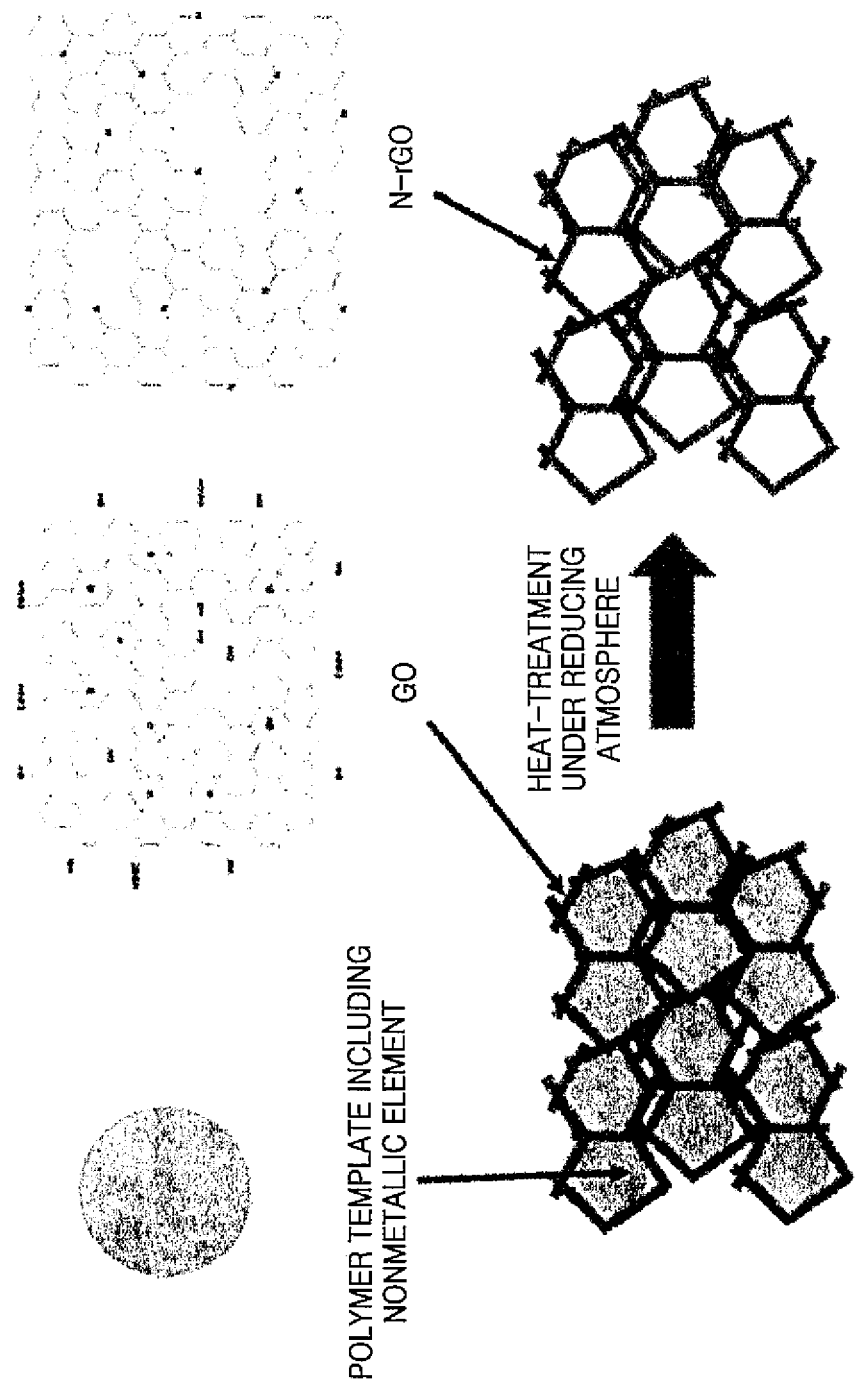
FIG. 2 is a schematic diagram for describing a method of preparing a thermoelectric material according to an embodiment.

One or more embodiments include thermoelectric materials having excellent thermoelectric properties.

One or more embodiments include thermoelectric modules and thermoelectric devices including the thermoelectric materials.

One or more embodiments include methods of preparing the thermoelectric materials.

Additional aspects will be set forth in part in the description which follows and, in part, will be apparent from the description, or may be learned by practice of the presented embodiments.

According to one or more embodiments, a thermoelectric material including a thermoelectric composite structure includes a plurality of pores, and graphene disposed between the plurality of pores and doped with a nonmetallic element.

According to one or more embodiments, a thermoelectric material including a self-standing flexible thermoelectric composite structure includes a polymer layer having a glass transition temperature (Tg) of about 50° C. or greater, and a thin film of a material having a Seebeck coefficient of ±1 μV/K or greater coated on one surface of the polymer layer.

According to one or more embodiments, a thermoelectric device includes the thermoelectric composite structure.

According to one or more embodiments, a method of preparing a thermoelectric material includes mixing a polymer template solution including a nonmetallic element and a graphene solution and dispersing the mixture to prepare a dispersion, and preparing the thermoelectric composite structure by filtering and drying the dispersion and heat-treating the dried resultant under a reducing atmosphere.

According to one or more embodiments, a method of preparing a thermoelectric material includes coating a thin film of a material having a Seebeck coefficient of ±1 μV/K or greater on one surface of a substrate, coating a polymer precursor solution for forming a polymer having a glass transition temperature (Tg) of about 50° C. or greater on a top surface of the material thin film, forming a polymer layer on the top surface of the material thin film by curing the polymer precursor solution, and preparing the self-standing flexible thermoelectric composite structure by separating the polymer layer formed on the top surface of the material thin film from the substrate.

According to one or more embodiments, a thermoelectric material is prepared according to the method.

According to one or more embodiments, a thermoelectric module includes the thermoelectric material.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, thermoelectric materials, thermoelectric modules and thermoelectric devices including the same, and methods of preparing the thermoelectric materials will be described in detail with reference to the accompanying drawings.

A thermoelectric material according to an embodiment may include a thermoelectric composite structure including a plurality of pores and graphene disposed between the plurality of pores and doped with a nonmetallic element.

FIG. 1 is a schematic diagram of a thermoelectric material according to an embodiment.

Referring to FIG. 1, a thermoelectric material 1 may have a plurality of pores 2 and graphene 3 disposed between the plurality of pores 2 and doped with a nonmetallic element. For example, the thermoelectric material 1 may have a plurality of pores 2 and a framework of a plurality of graphenes 3 surrounding the plurality of pores 2 and doped with the nonmetallic element. Also, the framework of the plurality of graphenes 3 doped with the nonmetallic element may be filled between the plurality of pores 2. The plurality of pores 2 may have a variety of pore diameters of about 1 nm to about several tens of μm. For example, the plurality of pores 2 may have a mesoporous pore diameter of about 2 to about 50 nm or a macroporous pore diameter of about 50 nm to about several μm.

The plurality of pores 2 of the thermoelectric material 1 may reduce thermal conductivity of the entire thermoelectric material 1 by controlling an inner structure of the thermoelectric material 1 and reducing thermal conductivity caused by lattice vibration.

In general, graphene is an allotrope of carbon in the form of a two-dimensional, atomic-scale, honey-comb lattice having a condensed polycyclic structure. A graphene layer formed by laminating graphene has excellent electrical properties due to high charge mobility. Thermal conductivity of a graphene layer in an out-of-plane direction (direction perpendicular to a plane) may be less than that in an in-plane direction (within the plane) since phonons are scattered and cannot be transferred in the out-of-plane direction. Thus, these in-plane or out-of-plane properties of graphene, if applied to a thermoelectric material, may increase electrical conductivity and reduce thermal conductivity, thereby improving the performance of the thermoelectric material. However, preparation of a graphene layer via chemical vapor deposition (CVD), which requires designated equipment, is not suitable for practical applications.

Thus, the present inventors used graphene doped with a nonmetallic element. The nonmetallic element-doped graphene has a polycyclic structure in which some of the 6 carbon atoms constituting graphene are substituted with the nonmetallic element. The nonmetallic element-doped graphene is easily prepared without using the designated equipment required for CVD, resulting in a reduction in manufacturing costs.

Also, the nonmetallic element-doped graphene may improve electrical conductivity via conversion into a thermoelectric material having n-type properties.

However, if graphene is doped with another element in the honey-comb lattice of 6 carbon atoms to convert the thermoelectric material to have n-type properties, it is difficult to control a doping amount and stability thereof may deteriorate.

The thermoelectric material 1 may have a three-dimensional (3D) interpenetrating structure. The plurality of pores 2 of the thermoelectric material 1 may be connected to form a channel.

Since the thermoelectric material 1 having the 3D interpenetrating structure provides a 3D electron transfer pathway, high electrical conductivity may be achieved by using the thermoelectric material 1.

The doped nonmetallic element may include at least one element selected from Group XIII elements, Group XIV elements, Group XV elements, and Group XVI elements. At least one of boron (B), aluminum (Al), gallium (Ga), and indium (In) may be used as the Group XIII elements. At least one of carbon (C), silicon (Si), germanium (Ge), tin (Sn), and lead (Pb) may be used as the Group XIV elements. At least one of phosphorous (P), arsenic (As), antimony (Sb), and bismuth (Bi) may be used as the Group XV elements. At least one of sulfur (S), selenium (Se), and tellurium (Te) may be used as the Group XVI elements.

For example, the doped nonmetallic element may include at least one element selected from boron (B), nitrogen (N), sulfur (S), and phosphorus (P). A thermoelectric material including a thermoelectric composite structure having a shell including the nonmetallic element-doped functionalized graphene layer may have high electrical conductivity.

The nonmetallic element-doped graphene 3 may include a p-type or n-type reduced graphene oxide (rGO). For example, the nonmetallic element-doped graphene may be an n-type rGO. The n-type rGO is an rGO in which electrons serve as main carriers. For example, the n-type rGO may be prepared by reducing a graphene oxide doped with the nonmetallic element including at least one of N, S, and P via a physiochemical method or high temperature heat-treatment. Since the n-type rGO is prepared by substituting some of the 6 carbon atoms with the nonmetallic element while maintaining a $sp^2$ structure, electrical conductivity may be improved with high thermal conductivity.

The nonmetallic element-doped graphene 3 may have 1 to 100 layers. For example, the nonmetallic element-doped graphene 3 may have 1 to 50 layers. For example, the nonmetallic element-doped graphene 3 may have 1 to 10 layers. For example, the nonmetallic element-doped graphene 3 may have 1 to 7 layers. For example, the nonmetallic element-doped graphene 3 may have 1 to 5 layers. For example, the nonmetallic element-doped graphene may have 1 to 3 layers. If the nonmetallic element-doped graphene 3 has these thicknesses, phonons are scattered by influence of interlayer interfaces to improve thermoelectric characteristics in the out-of-plane direction and doping of the nonmetallic element may be controlled more efficiently.

The thermoelectric material 1 may be a product of heat-treatment performed under a reducing atmosphere.

A thermoelectric device according to another embodiment may include the aforementioned thermoelectric material.

For example, the thermoelectric material may be molded by cutting or the like to prepare the thermoelectric device. The thermoelectric device may be a p-type or n-type thermoelectric device. For example, the thermoelectric device may be an n-type thermoelectric device. The thermoelectric device refers to a device including the thermoelectric material in a predetermined shape, for example, a rectangular parallelepiped shape.

The thermoelectric device may include a thermoelectric module in which the p-type and n-type thermoelectric materials are alternately arranged. The thermoelectric module may have a film shape including the p-type and n-type thermoelectric materials. However, the shape of the thermoelectric module is not limited thereto.

The thermoelectric device may provide a cooling effect by current application in a state of being coupled with an electrode or provide a power generation effect by a temperature difference.

A method of preparing a thermoelectric material, according to another embodiment, may include: mixing a polymer template solution including a nonmetallic element with a graphene solution and dispersing the mixture to prepare a dispersion; and preparing the aforementioned thermoelectric composite structure by filtering and drying the dispersion and heat-treating the dried resultant under a reducing atmosphere.

First, the polymer template solution including a nonmetallic element and the graphene solution are prepared, respectively.

The nonmetallic element may include at least one element selected from Group XIII elements, Group XIV elements, Group XV elements, and Group XVI elements. For example, the nonmetallic element may include at least one element selected from boron (B), nitrogen (N), sulfur (S), and phosphorus (P). For example, the nonmetallic element may include at least one element selected from N, S, and P. The polymer template solution may include at least one polymer selected from polystyrene, polyethylene, polypropylene, polyvinyl chloride, polyethylene oxide, a copolymer thereof, or a mixture thereof. For example, the polymer of the polymer template solution may be polystyrene.

The polymer template solution including a nonmetallic element may be prepared by mixing a monomer of the polymer with an organic solvent, adding a polymerization initiator to the mixture, and heat-treating the resultant mixture. The polymerization initiator may be 2,2'-azobis(2-methylpropionamide)dihydrochloride (AIBA), or the like. However, any polymerization initiator available in the art may also be used without limitation.

The graphene solution may include a graphene oxide solution.

Next, the prepared polymer template solution including a nonmetallic element and the graphene solution are dispersed by using a bath-type sonicator to obtain a dispersion.

Then, the dispersion is filtered and dried, and the dried resultant is heat-treated under a reducing atmosphere to prepare the thermoelectric composite structure.

The filtering may be performed by using a polytetrafluoromethylene (PTFE) membrane filter, and a filtrate is dried at room temperature. The resultant is heat-treated under a reducing atmosphere.

The reducing atmosphere may be an inert gas atmosphere. For example, the reducing atmosphere may be a nitrogen (N) gas atmosphere or an argon (Ar) gas atmosphere. Electrical conductivity may be improved by converting the thermoelectric material having p-type properties into the thermoelectric material having n-type properties under the reducing atmosphere. However, if the thermoelectric material having n-type properties is obtained by heat-treatment performed using ammonia gas after separation oxidized graphite, stability may deteriorate due to the ammonia gas.

The heat-treatment may be performed at a temperature of about 200° C. to about 1500° C. For example, the heat-treatment may be performed at a temperature of about 500° C. to about 1200° C. For example, the heat-treatment may be performed at a temperature of about 500° C. to about 1100° C. The heat-treatment may be a two-stage process to completely remove the polymer template including the nonmetallic element. That is, in a first stage, the dried resultant may be heated at a rate of 1° C./min to 5° C./min from room temperature to about 500° C. and maintained at the same temperature for about 30 minutes to about 1 hour. In a second stage, the resultant may be heated at a rate of 1° C./min to 5° C./min from about 500° C. to about 1100° C. and maintained at the same temperature for about 30 minutes to about 2 hours to prepare the aforementioned thermoelectric composite structure.

The preparation of the thermoelectric composite structure includes forming a plurality of pores by removing a polymer template constructed from the polymer template solution, and preparing a thermoelectric composite structure including a p-type or n-type rGO doped with a nonmetallic element derived from the polymer template. Thus, the thermoelectric material including the thermoelectric composite structure may be efficiently prepared with reduced time and costs by using the aforementioned method enabling mass production.

A volume of the p-type or n-type rGO doped with the nonmetallic element may be about 5% by volume to about 90% by volume based on a total volume of polymer particles of the polymer template and the rGO. For example, the volume of the p-type or n-type rGO doped with the nonmetallic element may be from about 40% by volume to about 80% by volume based on the total volume of the polymer particles of the polymer template and the rGO.

A thermoelectric material according to another embodiment may include a self-standing flexible thermoelectric composite structure including a polymer layer having a glass transition temperature (Tg) of about 50° C. or greater, and a thin film of a material having a Seebeck coefficient of ±1 μV/K or greater coated on one surface of the polymer layer. For example, the glass transition temperature (Tg) of the polymer layer may be 200° C. or greater. The material may be concentrated in a direction away from a bonding portion between the coated thin film and the polymer layer.

The thermoelectric material may have high thermoelectric properties and a light weight.

The thin film may be an n-type or p-type thin film.

The material may be an organic material, an inorganic material, or an organic-inorganic composite.

The organic-inorganic composite may be a blend of the organic material and the inorganic material or composites of the organic material and the inorganic material in which the inorganic material is coated on the surface of the organic material or the organic material is coated on the inorganic material.

Figure 9:
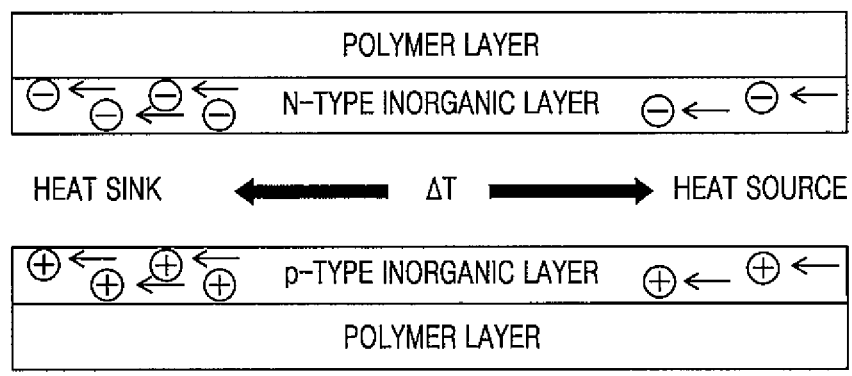
FIG. 9 is a schematic diagram for describing behavior of carriers in a thermoelectric device including a thermoelectric material having a flexible thermoelectric composite structure according to an embodiment.

FIG. 9 is a schematic diagram illustrating behavior of carriers in a thermoelectric device including a thermoelectric material having a flexible thermoelectric composite structure according to an embodiment.

Referring to FIG. 9, the thermoelectric device including the thermoelectric material having the flexible thermoelectric composite structure has thermoelectric properties obtained by transfer of charged carriers when a temperature gradient occurs between both ends of the thermoelectric device. In this case, the thermoelectric material may adjust the type of charged carriers included therein to n-type (free electrons) or p-type (free holes).

In general, polymer layers are formed of insulating materials and may inhibit transfer of carriers. Thus, a thermoelectric device including a thermoelectric material having a thermoelectric composite structure including a polymer layer and a thermoelectric material thin film may have low electrical conductivity and thus thermoelectric properties thereof deteriorate.

In order to prevent deterioration of thermoelectric properties, methods of increasing the amount of the thermoelectric material having thermoelectric properties have been used in conventional thermoelectric materials having the thermoelectric composite structure including the polymer layer and the thermoelectric material thin film.

However, in this case, the weight of the thermoelectric composite structure including the polymer layer and the inorganic thin film increases due to the high density of an inorganic material included in the thermoelectric material, and thus the thermoelectric material cannot be applied to various structures.

Also, a thermoelectric material having low dispersibility in a polymer solution may agglomerate. Thus, carrier transfer is inhibited to reduce electrical conductivity, thereby deteriorating thermoelectric properties. Therefore, materials available as the thermoelectric material are limited.

In addition, when the thermoelectric material is directly coated on the polymer substrate, the solvent used to disperse the thermoelectric material may be limited in accordance with properties of the substrate. In other words, if the thermoelectric material is dispersed in a solvent having no affinity with the substrate, a uniform thin film cannot be formed, and thus thermoelectric properties may deteriorate.

Since the material is concentrated on the surface of the thin film in the flexible thermoelectric composite structure of the thermoelectric material according to an embodiment, the thermoelectric material may have high electrical conductivity. In addition, the thermoelectric material including the polymer layer having the glass transition temperature (Tg) or 50° C. or greater, for example, 200° C. or greater, may be applied to apparatuses, where heal of 200° C. or greater is generated, such as automobiles.

Since the thermoelectric material according to an embodiment is prepared by coating a polymer solution on a thermoelectric material, any solvent available for coating a material on a flexible substrate may be used without limitation.

Figure 10:
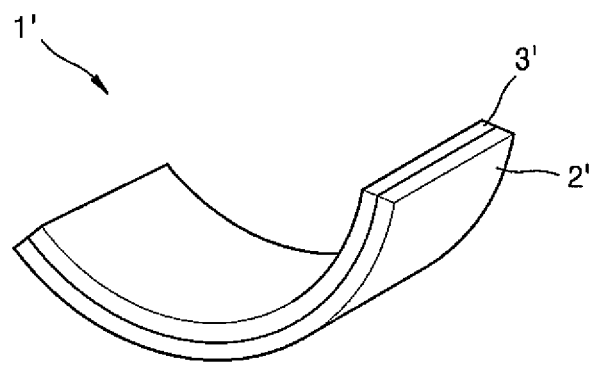
FIG. 10 is a schematic diagram of a flexible thermoelectric composite structure of a thermoelectric material according to an embodiment.
Figure 11:
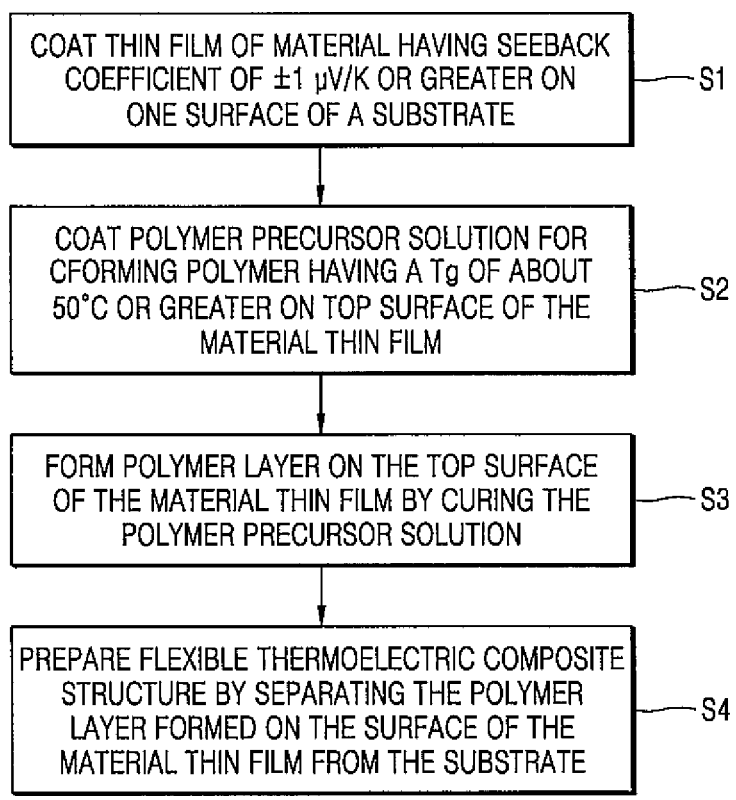
FIG. 11 is a flowchart for describing a method of preparing a flexible thermoelectric composite structure included in a method of preparing a thermoelectric material according to an embodiment.

FIG. 10 is a schematic diagram of a flexible thermoelectric composite structure of a thermoelectric material according to an embodiment.

Referring to FIG. 10, a flexible thermoelectric composite structure 1' has a structure in which a polymer layer 3' having a glass transition temperature (Tg) of about 50° C. or greater is disposed on an inorganic thin film 2'.

The organic material or inorganic material may be a one-dimensional (1D) nanomaterial.

Throughout the specification, the term "one-dimensional nanomaterial (1D)" refers to a nano-sized material having a nano-level diameter and an aspect ratio greater than 1 in contact with adjacent elements not via a point but via a surface. The 1D nanomaterial may have a diameter of about 1 nm to about 100 nm and include both "single" and "plural" nanomaterials.

The 1D nanomaterial secures a carrier transfer pathway and limits transfer of phonons, which, transfer with relatively shorter wavelengths than electrons by increased interfaces. Thus, the thermoelectric material having the flexible thermoelectric composite structure including the inorganic material may have reduced thermal conductivity.

The organic material may include at least one selected from single-walled or multi-walled carbon nanotubes, graphene, a polyacetylene-based polymer, a polypyrrole-based polymer, a polythiophene-based polymer, a polyaniline-based polymer, a polyphenylene sulfide-based polymer, and a polyphenylene oxide-based polymer. The graphene may have a thickness of about 1 nm to about 10 nm. The organic material may further include a polymer having conductivity of about 1 (S/cm) to about 10,000 (S/cm) in addition to the aforementioned polymer.

The inorganic material may include at least one of a nanoparticle, a nanowire, a nano-belt, a nanoribbon, and a combination thereof of at least one element selected from transition metals, rare-earth elements, Group XIII elements, Group XIV elements, Group XV elements, and Group XVI elements.

For example, the inorganic material may include at least one selected from a tellurium nanoparticle, a tellurium nanowire, a tellurium nano-belt, a tellurium nanoribbon, a bismuth nanoparticle, a bismuth nanowire, a bismuth nano-belt, a bismuth nanoribbon, a selenium nanoparticle, a selenium nanowire, a selenium nano-belt, a selenium nanoribbon, an antimony nanoparticle, an antimony nanowire, an antimony nano-belt, an antimony nanoribbon, and a combination thereof.

Throughout the specification, the term "nanowire" refers to a wire having a nano-level diameter and an aspect ratio of about 100 or greater with no length limitation. As used herein, the term "nano-belt" refers to a belt having nano-level thickness and width. As used herein, the term "nanoribbon" refers to a ribbon having a nano-level width and having an aspect ratio of about 10 or greater.

Examples of the inorganic material may include a tellurium nanoparticle, a bismuth nanoparticle, or a $Bi_2Te_3$ nanoparticle.

An amount of the material may be about 0.01 to about 90 parts by weight, for example, about 0.01 to about 70 parts by weight, and for example, about 1 to about 50 parts by weight, and for example, about 1 to about 30 parts by weight, based on 100 parts by weight of the thermoelectric composite structure. Within these ranges, the thermoelectric material having the thermoelectric composite structure including the material may have sufficient electrical conductivity.

The polymer layer may include at least one polymer selected from polyimide, poly-carbonate, polyacrylate, polymethacrylate, polymethyl methacrylate, polyvinylidene, polyvinylidene fluoride, polystyrene, and urethane-based epoxy resin.

The polymer layer may include a polymer having a repeating unit represented by Formula 1 below.

Formula 1

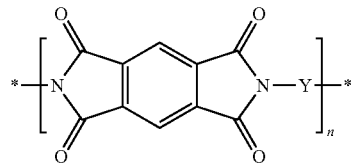

where Y is a divalent organic group, and
n is an integer from 1,000 to 1,500,000.

Y of Formula 1 may include at least one of the organic groups represented by Formulae 1-1 to Formula 1-14 below:

Formula 1-1

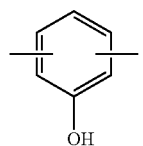

Formula 1-2

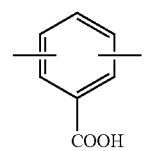

Formula 1-3

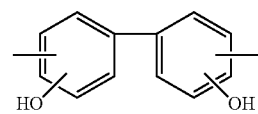

Formula 1-4

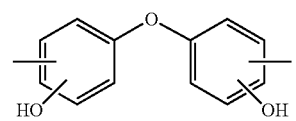

Formula 1-5

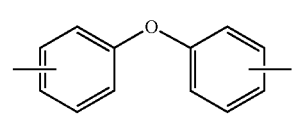

Formula 1-6

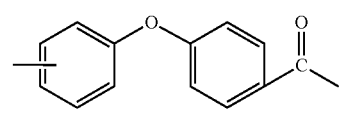

Formula 1-7

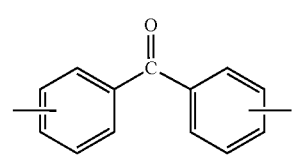

Formula 1-8

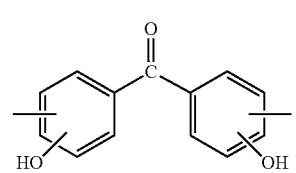

Formula 1-9

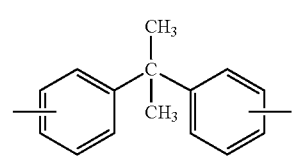

Formula 1-10

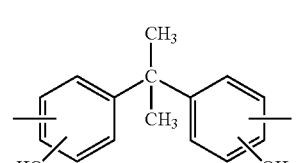

Formula 1-11

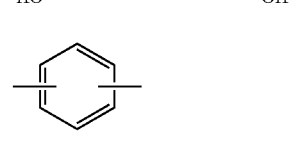

Formula 1-12

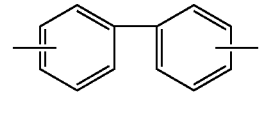

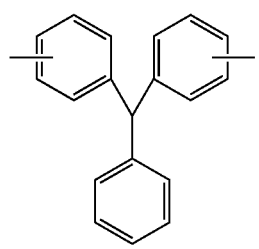

Formula 1-13

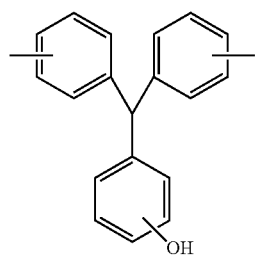

Formula 1-14

In Formula 1, Y may be a divalent organic group derived from diamine benzoic acid.

In Formula 1, n may be an integer from 10,000 to 500,000.

The polymer layer including the aforementioned polymer may be applied to apparatuses in which high-temperature heat is generated and may be flexible. Thus, the flexible thermoelectric composite structure of the thermoelectric material may be applied to apparatuses having various structures such as a curved surface.

A thermoelectric device according to another embodiment may include a thermoelectric material having the aforementioned flexible thermoelectric composite structure. The flexible thermoelectric composite structure may be efficiently used as the thermoelectric material. The thermoelectric device may be a p-type or n-type thermoelectric device. The thermoelectric device refers to a device including the thermoelectric material in a predetermined shape, for example, a rectangular parallelopiped shape.

The thermoelectric device may include a thermoelectric module in which the p-type and n-type thermoelectric materials are alternately arranged. The thermoelectric module may have a film shape including the p-type and n-type thermoelectric materials. However, the shape of the thermoelectric module is not limited thereto.

The thermoelectric device may provide a cooling effect by current application in a state of being coupled with an electrode or provide a power generation effect by a temperature difference.

A method of preparing a thermoelectric material, according to another embodiment, includes: coating a thin film on one surface of a substrate using a material having a Seebeck coefficient of ±1 μV/K or greater; coating a polymer precursor solution for forming a polymer having a glass transition temperature (Tg) of about 50° C. or greater on a top surface of the material thin film; forming a polymer layer on the top surface of the material thin film by curing the polymer precursor solution; and preparing the aforementioned self-standing flexible thermoelectric composite structure by separating the polymer layer formed on the top surface of the material thin film from the substrate.

First, the substrate is prepared. The substrate may include a glass, ceramic, stainless steel, metal, and/or polymer substrate.

Next, the material having a Seebeck coefficient of ±1 μV/K or greater, for example, an organic material, an inorganic material, or an organic-inorganic composite thin film, is coated on one surface of the substrate (S1). The organic material, the inorganic material, or the organic-inorganic composite are as described above.

The coating of the material thin film may be performed by spin coating, doctor blading, vacuum filtering, or impregnating. The thin film having a uniform thickness may be formed using a small amount of an inorganic material by spin coating among these coating methods. For example, the material thin film may have a thickness of about 10 nm to about 50 μm.

Next, the polymer precursor solution for forming a polymer having a glass transition temperature (Tg) of about 50° C. or greater is coated on a top surface of the material thin film (S2). For example, the polymer precursor solution may have a glass transition temperature (Tg) of about 200° C. or greater.

The polymer precursor solution may include a polymer precursor represented by Formula 2 below.

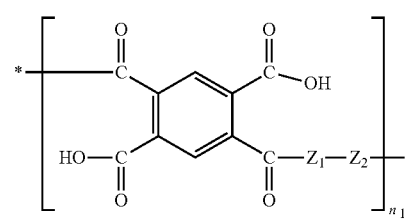

Formula 2 where, $Z_1$ is at least one of a carbonyl group, a hydroxyl group, an amide group, a sulfonyl group, or a combination thereof;

$Z_2$ is a divalent organic group; and $n_1$ is an integer from 1,000 to 1,500,000.

In Formula 2, $Z_2$ may include at least one of the organic groups represented by Formulae 1-1 to 1-14 below.

In Formula 2, $n_1$ may be an integer from 10,000 to 500,000.

The coating of the polymer precursor solution may include a doctor blading process. Via the doctor blading process, the polymer layer may have a fine thickness. In addition, adhesiveness to the top surface of the material thin film may be increased by using the polymer precursor solution. For example, the polymer layer may have a thickness of about 1 nm to about 10 μm.

Next, the polymer precursor solution is cured to form the polymer layer on the top surface of the material thin film (S3).

The forming of the polymer layer on the top surface of the material thin film may include curing the polymer precursor solution by heat-treatment at a temperature of about 50° C. to about 500° C. or light treatment using visible or ultraviolet rays for about 30 minutes to about 24 hours. The heat-treatment may be performed for about 0.5 to about to about 30 but may be adjusted in accordance with types of the polymer, or the like. The heat-treatment may be performed under atmospheric conditions or under an oxidizing atmosphere.

The polymer precursor solution may further include a polymerization initiator. If required, the polymer precursor solution may further include a conductive agent, an emulsifier, and a dispersant.

Examples of the polymerization initiator may include an organic peroxide such as lauroyl peroxide, diisopropyl peroxydicarbonate, di-2-ethylhexylperoxydicarbonate, t-butyl peroxypivalate, and 3,3,5-trimethylhexanoylperoxide; an azo compound such as α,α'-azobisisobutyronitrile; ammonium persulfate; and potassium persulfate. The polymerization initiator may be used alone or in combination of at least two thereof in a desired ratio. However, the polymerization initiator is not limited thereto, and any polymerization initiator well known in the art may also be used.

An amount of the polymerization initiator may be adjusted to an amount commonly used in thermal polymerization. Also, an additive such as an amine may be used as a polymerization aid. Also, the conductive agent, the emulsifier, or the dispersant may be used in amounts commonly used in thermal polymerization.

The polymer layer formed on the top surface of the material thin film is separated from the substrate to prepare the aforementioned flexible thermoelectric composite structure (S4).

The method may further include impregnating the polymer layer formed on the top surface of the material thin film with an aqueous solvent before separating the polymer layer from the substrate.

The aqueous solvent may be water or an alcohol solvent. Examples of the alcohol solvent may include methanol, ethanol, and propanol. For example, the alcohol solvent may be methanol. The aforementioned self-standing flexible thermoelectric composite structure may be obtained by impregnating the polymer layer with the aqueous solvent.

A method of preparing a thermoelectric material, according to another embodiment, will be described below.

Figure 17:
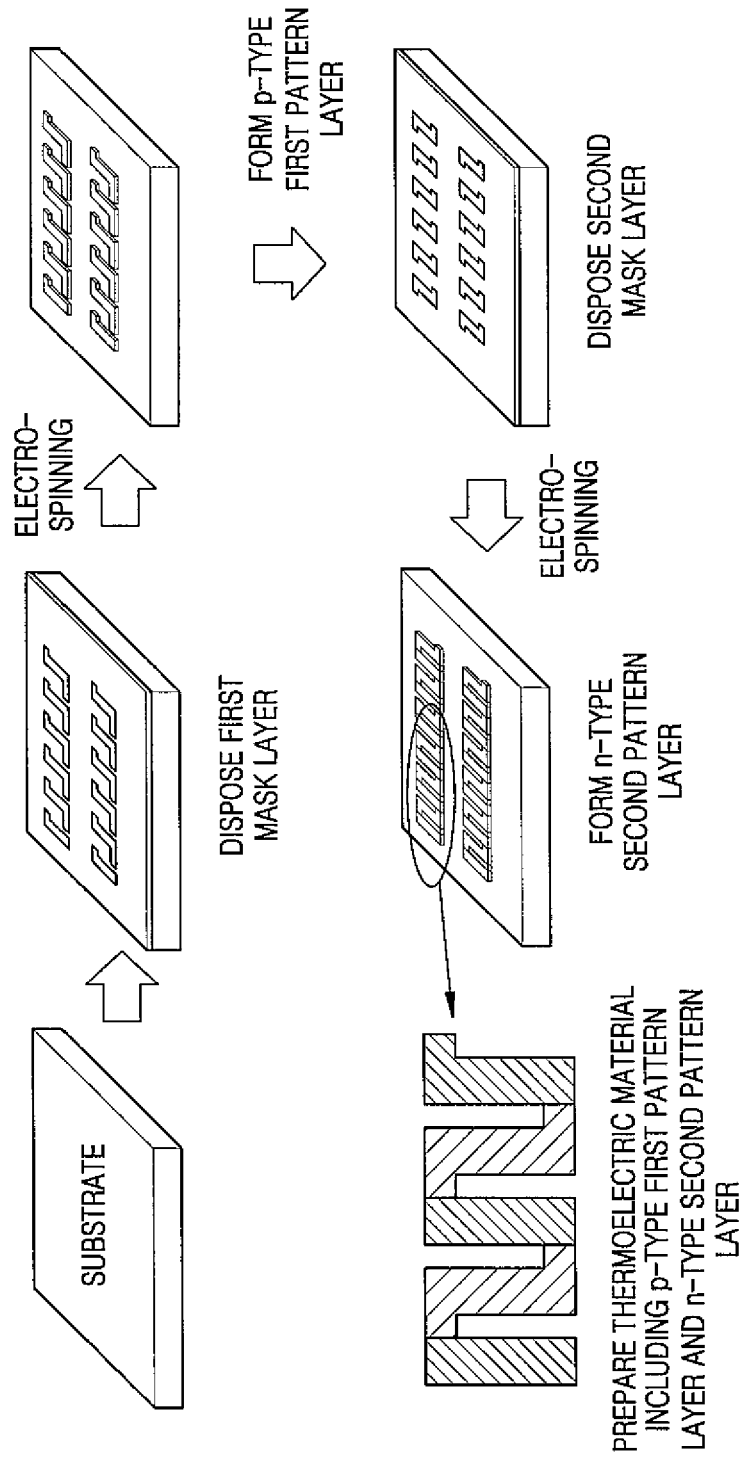
FIG. 17 is a schematic diagram illustrating a method of preparing a thermoelectric material, according to another embodiment.

FIG. 17 is a schematic diagram illustrating a method of preparing a thermoelectric material, according to another embodiment.

Referring to FIG. 17, the method of preparing a thermoelectric material includes: disposing a first mask layer having a first pattern on a substrate; forming a first pattern layer on the substrate by spraying a first dispersion onto the first mask layer; removing the first mask layer from the substrate and disposing a second mask layer having a second pattern opposite to the first pattern layer onto the substrate on which the first pattern layer is formed; forming a second pattern layer having the second pattern on the substrate by spraying a second dispersion on the second mask layer; and preparing a thermoelectric material by removing the second mask layer from the substrate and adhering the first pattern layer and the second pattern layer formed on the substrate together.

The substrate may include a polymer having a glass transition temperature (Tg) of about 50° C. or greater. The polymer may have a glass transition temperature (Tg) of about 200° C. or greater, for example, about 300° C. or greater. If the glass transition temperature (Tg) of the polymer is greater than 200° C., for example, greater than 300° C., and thermoelectric material may be applied to apparatuses, where heat of 200° C. or greater, for example, 300° C. or greater, is generated, such as automobiles.

The substrate may include at least one polymer selected from polyimide, poly-carbonate, polyacrylate, polymethacrylate, polymethyl methacrylate, polyvinylidene, polyvinylidene fluoride, polystyrene, and urethane-based epoxy resin. For example, the substrate may include polyimide.

The substrate may be flexible. By using the flexible substrate, the thermoelectric material may be applied to various devices having various shapes with a curved surface, such as, exhaust pipes for automobiles and a thermoelectric module having a light weight and flexibility may be prepared.

The spraying may be performed by electrospinning or electrospraying. Thermoelectric properties of the thermoelectric module including the thermoelectric material may be improved by controlling thicknesses of the first pattern layer and/or the second pattern layer formed on the substrate by adjusting spinning or spraying time or the number of times spinning or spraying.

Figure 18:
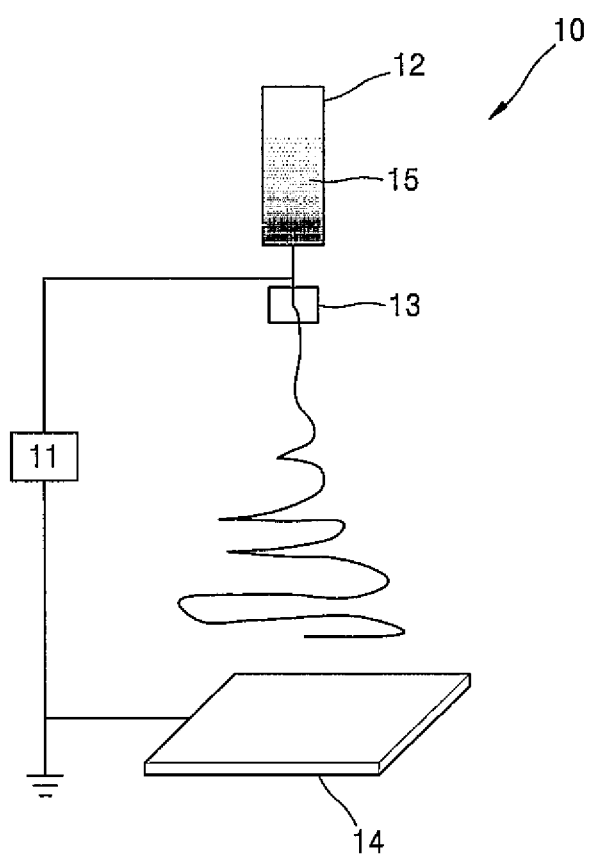
FIG. 18 is a schematic diagram of an electrospinning apparatus used to perform a method of preparing a thermoelectric material according to an embodiment.

FIG. 18 is a schematic diagram of an electrospinning apparatus 10 used to perform a method of preparing a thermoelectric material according to an embodiment.

Referring to FIG. 18, a first dispersion or a second dispersion is supplied to a nozzle 13 through a syringe 12. When a voltage is applied to the nozzle 13 and a collector 14 by a power supply 11, a solvent of the first dispersion or second dispersion contained in the nozzle 13 is immediately evaporated by a high voltage, and thus a first nanofiber or a second nanofiber is obtained by capillary phenomenon and high voltage.

The first nanofiber or the second nanofiber may have a diameter of about 1 nm to about 1000 nm. The first nanofiber or the second nanofiber may have an aspect ratio (length:diameter) of about 100 to about 100.000.

For example, the electrospinning may be performed at a voltage of about 5 to about 25 kV at a temperature of about 20 to about 30° C. Also, the first dispersion or second dispersion may be injected by the syringe 12 at an injection speed of about 1 to about 30 μm/h. Also, a distance between a tip of the nozzle 13 and the collector 14 in the electrospinning apparatus 10 may be about 10 to about 20 cm.

The electrospinning apparatus 10 used to perform the method of preparing the thermoelectric material according to an embodiment is not limited, and any electrospinning apparatus commonly used in preparation of nanofibers may also be used. A size of the nozzle 13 of the electrospinning apparatus 10, a spraying speed, and pressure, and the like may be adjusted if desired.

The first nanofiber obtained by the electrospinning apparatus is sprayed onto the first mask layer to form the first pattern on the substrate. Or, the second nanofiber obtained by the electrospinning apparatus is sprayed onto the second mask layer to form the second pattern opposite to the first pattern on the substrate. The first pattern layer and the second pattern layer may have any patterns so long as the patterns constitute a single pattern after adhering without limitation.

To form the first pattern layer and/or the second pattern layer on the substrate, the first mask layer and/or the second mask layer are removed and the solvent is evaporated by heat-treatment. The heat-treatment may be performed at any temperature adjusted in accordance with the type of the solvent, or the like.

The first dispersion or the second dispersion may be a dispersion for forming the first pattern or a dispersion for forming the second pattern.

The dispersion for forming the first pattern or the dispersion for forming the second pattern may be a salt or complex of a material constituting the first pattern layer or the second pattern layer.

For example, the dispersion for forming the first pattern or the dispersion for forming the second pattern may be a nitrate, an oxide, a chloride, a sulfide, or an acetate of the material constituting the first pattern layer or the second pattern layer.

The dispersion for forming the first pattern or the dispersion for forming the second pattern may further include water or an organic solvent. The organic solvent may be any organic solvent dissolving the salt or complex of the material constituting the first pattern layer or the second pattern layer, which will be described later, without limitation.

The first pattern layer or the second pattern layer may include at least one element selected from transition metals, rare-earth elements, Group XIII elements, Group XIV elements, Group XV elements, and Group XVI elements. The rare-earth elements may include at least one of Y, Ce, and La. The transition metals may include at least one of Ti, Zr, Hf, V, Nb, Ta, Cr, Mo, W, Mn, Fe, Co, Ni, Cu, Zn, Ag, and Re. The Group XIII elements may include at least one of B, Al, Ga, and In. The Group XIV elements may include at least one of C, Si, Ge, Sn, and Pb. The Group XV elements may include at least one of P, As, Sb, and Bi. The Group XVI elements may include at least one of S, Se, and Te.

The first pattern layer and the second pattern layer may be opposite types of thermoelectric semiconductor material layers. For example, if the first pattern layer is a p-type thermoelectric semiconductor material layer, the second pattern layer may be an n-type thermoelectric semiconductor material layer. On the contrary, if the first pattern layer is an n-type thermoelectric semiconductor material layer, the second pattern layer may be a p-type thermoelectric semiconductor material layer.

The adhering process may be performed at a pressure of about 5 to about 500 kgf/cm². For example, the adhering process may be performed by cold compression or thermo-compression at a pressure of about 5 to about 500 kgf/cm². Since gaps between the first pattern layer and the second pattern layer are directly adhered together by using the aforementioned adhering process without using indirectly adhering by deposition using a metal, contact resistance may be reduced in the thermoelectric module including the thermoelectric material. In addition, the thermoelectric material may be mass produced within a short time by the aforementioned adhering process.

The prepared thermoelectric material may have an area specific resistance of about 1 to about 10 ohm/sq. For example, the prepared thermoelectric material may have an area specific resistance of about 5 to about 10 ohm/sq. Thus, the thermoelectric module including the prepared thermoelectric material may have high current density and thermoelectric efficiency.

The method may further include forming a coating layer including the same material as that of the substrate on the first pattern layer and the second pattern layer after adhering the first pattern layer and the second pattern layer and before preparing the thermoelectric material. The coating layer may prevent oxidation of the material constituting the first pattern layer and the second pattern layer in the air.

A thermoelectric material according to another embodiment may be prepared according to the aforementioned method of preparing a thermoelectric material.

A thermoelectric module according to another embodiment may include the aforementioned thermoelectric material.

Hereinafter, one or more embodiments will be described in detail with reference to the following examples and comparative examples. However, these examples and comparative examples are not intended to limit the purpose and scope of the one or more embodiments.

MODE FOR THE INVENTION

Examples

Preparation Example 1: Preparation of Graphene Oxide and Graphene Oxide Solution A graphene oxide was prepared from graphite powder according to the Hummer's method described below.

1 g of graphite powder, 0.5 g of sodium nitrate ($NaNO_3$), and 25 mL of sulfuric acid were added to a reaction flask, and the reaction flask was stirred for 1 hour and maintained in an ice bath. Then, 3 g of potassium permanganate ($KMnO_4$) was slowly added to the reaction flask at room temperature, and the reaction flask was further stirred for 1 hour to prepare a mixture and gradually heated to 35° C. 46 mL of $H_2O$ was added to the heated mixture, and a mixed solvent of 140 mL of $H_2O$ and 2.5 mL of $H_2O_2$ was added thereto. The resultant mixture was washed using a 10% HCl solution and deionized water. The washed resultant was freeze-dried to obtain graphene oxide powder.

200 mg of the obtained graphene oxide powder was dispersed in a 40 mL of $H_2O$ in a sonic bath at room temperature for 1 hour to obtain a dispersion. The obtained dispersion was centrifuged at a rate of 3000 rpm for 5 minutes and a transparent dark brown supernatant was collected in a vial to prepare a graphene oxide solution.

Preparation Example 2: Preparation of Polymer Template and Polymer Template Solution Polystyrene particles including nitrogen, as polymer template, were synthesized by emulsion polymerization.

26 mL of $H_2O$ was degassed in a nitrogen atmosphere for 1 hour and 648 mg of polyvinylpyrrolidone (PVP) was dissolved in 3 m of the degassed $H_2O$ to prepare an aqueous PVP solution. 2,2'-azobis(2-methylpropionamide)dihydrochloride (AIBA) was dissolved in 1 mL of the degassed $H_2O$ to prepare an aqueous AIBA solution, as a polymerization initiator. 2.62 g of a styrene monomer (manufactured by Sigma-Aldrich) was filtered through a predetermined amount of aluminum oxide for purification. The filtered styrene monomer was added to the aqueous PVP solution, and the mixture was degassed for 30 minutes to prepare a styrene monomer-containing solution. Then, the aqueous ATBA solution was quickly added to the styrene monomer-containing solution, and the mixture was maintained at 70° C. for 24 hours to synthesize nitrogen-containing polystyrene particles.

The synthesized nitrogen-containing polystyrene particles were added to a dialysis tube and the tube was immersed in $H_2O$ to prepare a nitrogen-containing polystyrene solution as a polymer template.

Example 1: Preparation of Thermoelectric Material 36 mg of the nitrogen-containing polystyrene solution having a concentration of 6.5% by weight prepared according to Preparation Example 2 was mixed with 20 mL of $H_2O$. 1 mL of the graphene oxide solution prepared according to Preparation Example 1 and having a concentration of 3.17 mg/ml was added to the mixed solution and dispersed at room temperature for 15 minutes in a bath-type sonicator to obtain a dispersion.

The dispersion was filtered using a PTFE membrane (having a pore diameter of 0.2 μm and a membrane diameter of 47 mm). A filtrate was dried under atmospheric conditions for 24 hours and the PTFE membrane was removed. Then, the resultant was heat-treated in an argon gas atmosphere. The heat-treatment includes two-stages to completely remove polystyrene. In a first stage, the dried resultant was heated from room temperature to 500° C. at a rate of 5° C./min and maintained at 500° C. for 1 hour. In a second stage, the resultant was heated to 1100° C. at a rate of 5° C./min and maintained at 1100° C. for 2 hours to prepare a thermoelectric material, which includes a thermoelectric composite structure having a plurality of pores, and an rGO doped between the plurality of pores and doped with nitrogen (N), where a volume of the rGO doped with nitrogen (N) was 40% by volume based on a total volume of the polymer template, i.e., the nitrogen-containing polystyrene particles, and the rGO.

Example 2: Preparation of Thermoelectric Material 97 mg of the nitrogen-containing polystyrene solution having a concentration of 6.5% by weight prepared according to Preparation Example 2 was mixed with 20 mL of $H_2O$. 1 mL of the graphene oxide solution prepared according to Preparation Example 1 and having a concentration of 3.17 mg/ml was added to the mixed solution and dispersed at room temperature for 15 minutes by using a bath-type sonicator to obtain a dispersion. A thermoelectric material including a thermoelectric composite structure having a plurality of pores, and an rGO doped between the plurality of pores and doped with nitrogen (N) was prepared in the same manner as Example 1, except that the volume of the rGO doped with nitrogen (N) was adjusted to 20% by volume based on a total volume of the polymer template, i.e., the nitrogen-containing polystyrene particles, and the rGO.

Example 3: Preparation of Thermoelectric Material

A solution prepared by dispersing 0.01 g of multi-walled carbon nanotubes (having an average diameter of about 10 to about 15 nm and an average length of about 0.5 to about 10 μm) in 50 mL of ethanol was dropped onto a PTFE substrate (having a thickness of 50 μm) having pores with a pore diameter of 0.2 μm, and an organic thin film having a thickness of about 20 μm including the multi-walled carbon nanotubes was coated on the substrate by vacuum filtering.

A polymer precursor solution for forming a polymer prepared by adding 1 g of a polymer precursor including a repeating unit represented by Formula 3 of Reaction Scheme 1 below to 10 ml of an N-methyl-2-pyrrolidone (NMP) solvent was coated on the top surface of the organic thin film by doctor blading.

The polymer precursor solution was cured by heat-treatment under atmospheric conditions at 100° C. for 30 minutes to form a polymer layer represented by Formula 4 of Reaction Scheme 1 on the top surface of the organic thin film. In this case, the polymer layer has a thickness of about 10 μm.

The organic thin film and the polymer layer formed on the organic thin film were separated from the substrate to prepare a thermoelectric material having a thermoelectric composite structure in which the multi-walled carbon nanotube thin film is concentrated on one surface of the polymer layer.

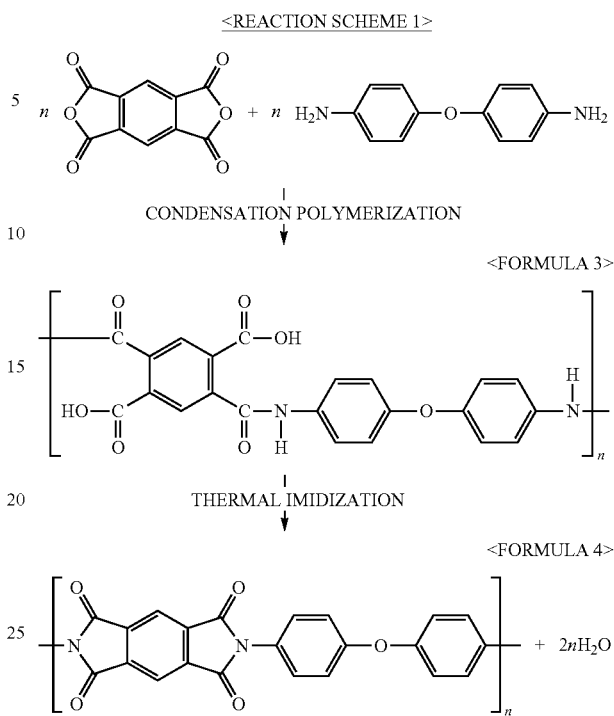

In Reaction Scheme 1, n is an integer from 1,000 to about 1,000,000.

Comparative Example 1: Preparation of Thermoelectric Material

The graphene oxide solution prepared according to Preparation Example 1 was filtered using a PTFE membrane (having a pore diameter of 0.2 μm and a membrane diameter of 47 mm). The filtrate was dried under atmospheric conditions for 24 hours, and the PTFE membrane was removed. Then, the resultant was heat-treated in an argon gas atmosphere. The heat-treatment was performed by heating the resultant from room temperature to 1100° C. at a rte of 5° C./min and maintaining the resultant at 1100° C. for 2 hours, thereby preparing a thermoelectric material having a thermoelectric structure of the rGO.

Comparative Example 2: Preparation of Thermoelectric Material 0.01 g of multi-walled carbon nanotubes (having an average diameter of about 10 to about 15 nm and an average length of about 0.5 to about 10 μm) and 0.1 g of a polymer precursor including a repeating unit represented by Formula 3 of Reaction Scheme 1 above were added to 1 mL of an NMP solvent and dispersed.

The dispersion was coated on a glass substrate (having a thickness of 1 mm) by doctor blading.

The dispersion was heat-treated under atmospheric conditions at 100° C. for 30 minutes to cure the polymer precursor including the repeating unit represented by Formula 3 of Reaction Scheme 1 above. Thus, a composite layer including the multi-walled carbon nanotubes and the polymer represented by Formula 4 of Reaction Scheme 1 above was formed on the glass substrate. In this case, the composite layer had a thickness of about 250 μm.

The composite layer was separated from the substrate to prepare a thermoelectric material having a thermoelectric composition in which the multi-walled carbon nanotubes are dispersed in the composite layer.

Analysis Example 1: Scanning Electron Microscope (SEM) Image Analysis

Surfaces of the thermoelectric materials prepared according to Example 2 and Comparative Example 1 were observed using an SEM. In this regard, the SEM analysis was performed using a JSM-7401F (manufactured by JEOL LTD., having a resolution of 1.0 nm and operated at 10 kV). The results are shown in FIGS. 3A and 3B, respectively.

Figure 3A:
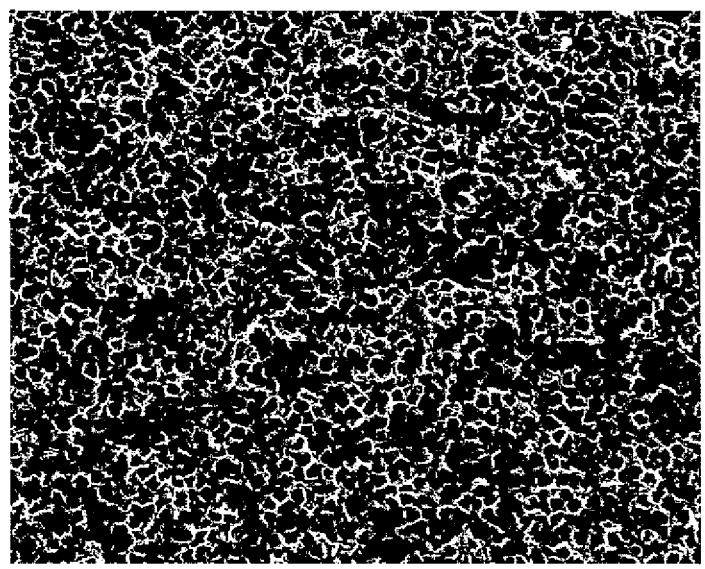
FIGS. 3A and 3B are Scanning Electron Microscope (SEM) images of surfaces of thermoelectric materials prepared according to Example 2 and Comparative Example 1.

Referring to FIG. 3A, it may be confirmed that the thermoelectric material prepared according to Example 2 has a plurality of pores and graphene disposed between the plurality of pores and doped with a nonmetallic element and has a three-dimensional interpenetrating structure.

Figure 3B:

Referring to FIG. 3B, the thermoelectric material prepared according to Comparative Example 1 has a structure with no pores.

In addition, sections of the thermoelectric materials prepared according to Example 3 and Comparative Example 2 were observed using an SEM. In this regard, the SEM analysis was performed using a JSM-761 OF (manufactured by JEOL LTD., operated at 5.0 kV). The results are shown in FIGS. 12 and 13, respectively.

Figure 12:
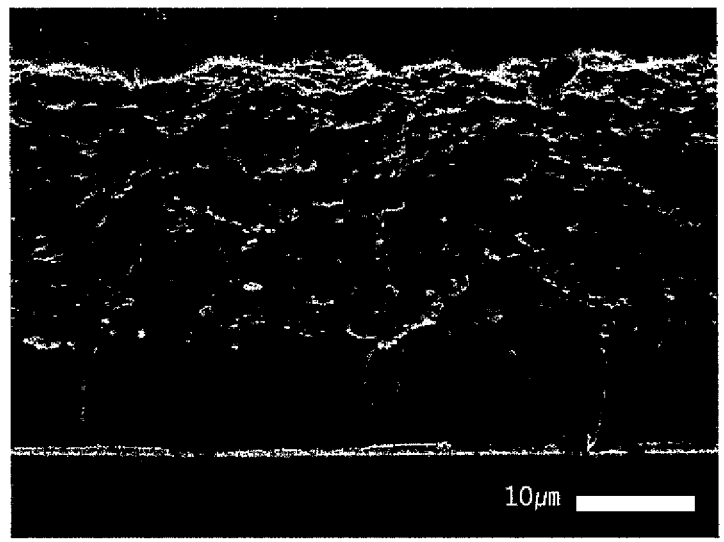
FIGS. 12 and 13 are SEM images of sections of thermoelectric materials prepared according to Example 3 and Comparative Example 2, respectively.

Referring to FIG. 12, it was confirmed that a multi-walled carbon nanotube thin film is concentrated on one surface of the polymer layer in the thermoelectric material prepared according to Example 3.

Figure 13:
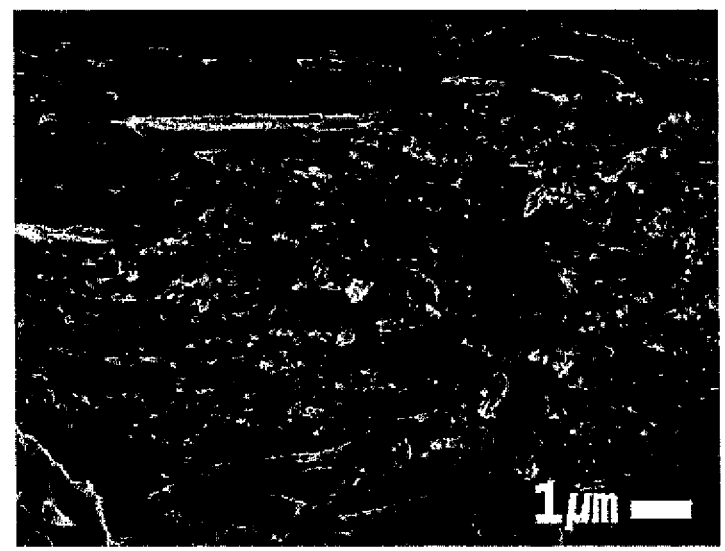

Referring to FIG. 13, it was confirmed that the multi-walled carbon nanotubes are distributed in the polymer and the multi-walled carbon nanotube composite layer in the thermoelectric material prepared according to Comparative Example 2.

Analysis Example 2: X-ray Photoelectron Spectroscopy (XPS) Analysis

Figure 4:
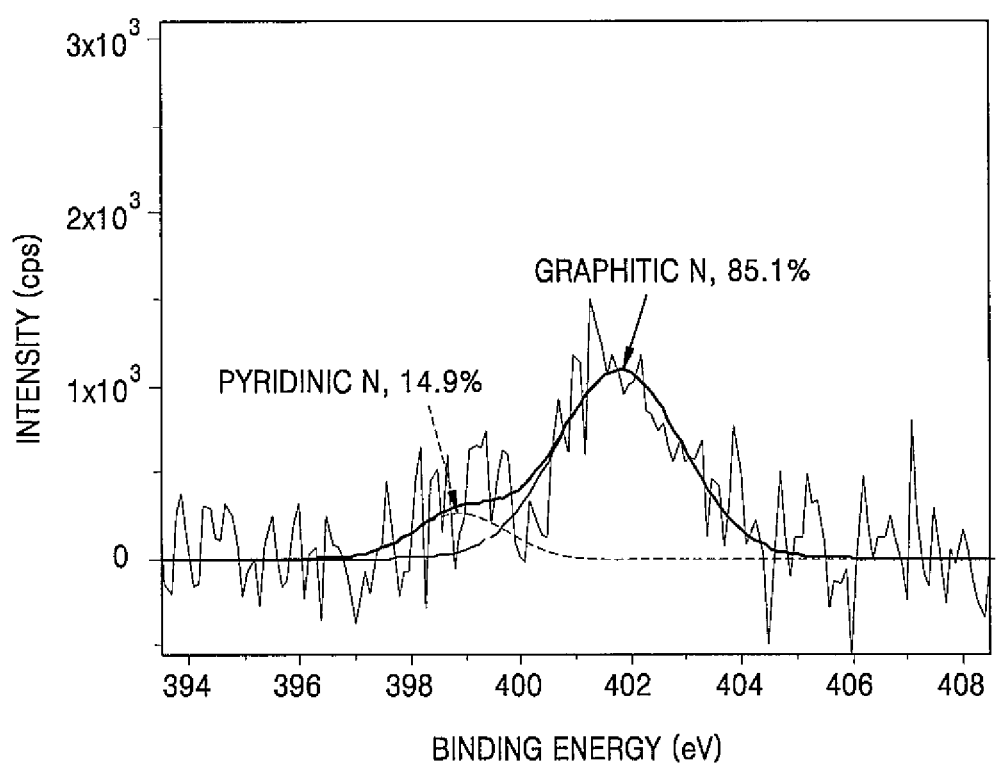
FIG. 4 is a graph illustrating N1s analysis results of X-ray Photoelectron Spectroscopy (XPS) of a thermoelectric material prepared according to Example 1.

The thermoelectric materials prepared according to Example 1 and Comparative Example 1 were analyzed by XPS. The result of N1s analysis is shown in FIG. 4. The XPS analysis was performed using a Thermo Scientific K-Alpha+ X-ray Photoelectron Spectrometer (XPS) (using an Al K alpha source and having a resolution of 0.1 eV).

Referring to FIG. 4, a peak corresponding to the rGO doped with N was clearly observed at around a binding energy of 402 eV in the thermoelectric material prepared according to Example 1.

Evaluation Example 1: Evaluation of Thermoelectric Properties

Thermoelectric properties of the thermoelectric materials prepared according to Example 1, Example 2, and Comparative Example 1 including electrical conductivity, Seebeck coefficient, and power factor were evaluated. The results are shown in FIG. 5 to 8, respectively.

The electrical conductivity ($\sigma$) was measured using a conventional 4-point-probe method at a temperature of about 300 to about 550K by calculating resistance based on current and voltage obtained by a Keithley 2400, calculating a specific resistance by compensating a volume, and calculating a reciprocal thereof. The Seebeck coefficient (S) was measured via linear correlation by measuring a voltage generated by a temperature difference. In this case, the resolution was increased using a nanovolt meter (34420A) to distinguish a lower voltage portion. The power factor, which is defined as $S^2\sigma$ as shown in Equation 1 above, was calculated by multiplying the electrical conductivity and the square of the Seebeck coefficient. The thermal conductivity (k) was obtained by measuring a thermal diffusivity using a Laser Flash Analysis (LFA) and multiplying specific heat and density as represented by Equation 2 below.

Thermal Conductivity (k, W·k/m)=thermal diffusivity ($cm^2/s$)×specific heat (J·k/g)×density ($g/cm^3$)  Equation 2

Figure 5:
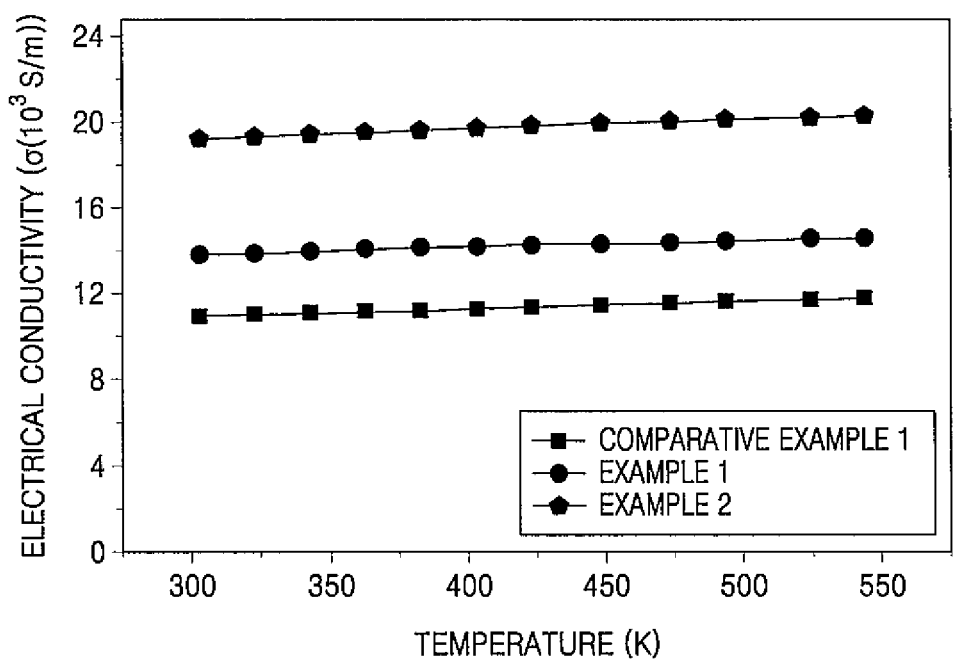
FIG. 5 is a graph illustrating electrical conductivities of thermoelectric materials prepared according to Example 1, Example 2, and Comparative Example 1.

Referring to FIG. 5, it was confirmed that the electrical conductivity ($\sigma$) of the thermoelectric materials prepared according to Examples 1 and 2 was higher than that of the thermoelectric material prepared according to Comparative Example 1 at a temperature of 300 to about 550K.

Figure 6:
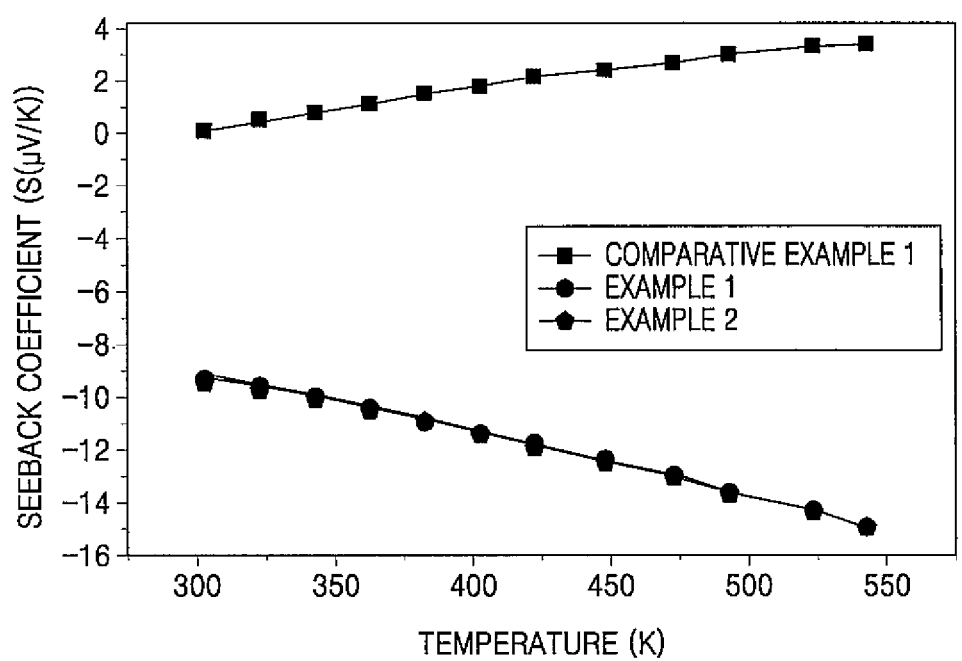
FIG. 6 is a graph illustrating Seebeck coefficients of thermoelectric materials prepared according to Example 1, Example 2, and Comparative Example 1.

Referring to FIG. 6, the thermoelectric material prepared according to Comparative Example 1 has a relatively low Seebeck coefficient (S) of about 0 to about 3 at a temperature of about 300 to about 550K. It was confirmed that nitrogen atoms included in the nitrogen-containing polystyrene particles are doped on the graphene oxide lattice since the Seebeck coefficients (S) of the thermoelectric materials prepared according to Examples 1 and 2 were negatively changed.

Figure 7:
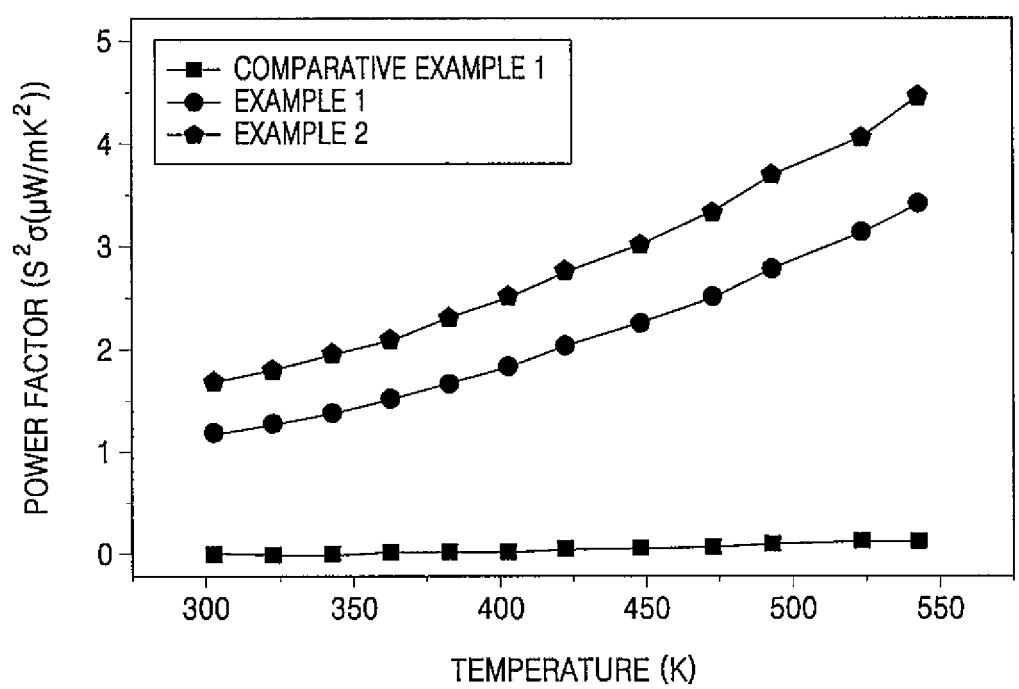
FIG. 7 is a graph illustrating power factors of thermoelectric materials prepared according to Example 1, Example 2, and Comparative Example 1.

Referring to FIG. 7, the power factor ($S^2\sigma$) of the thermoelectric materials prepared according to Examples 1 and 2 was greater than that of the thermoelectric material prepared according to Comparative Example 1 at a temperature of about 300 to about 500K.

Figure 8:
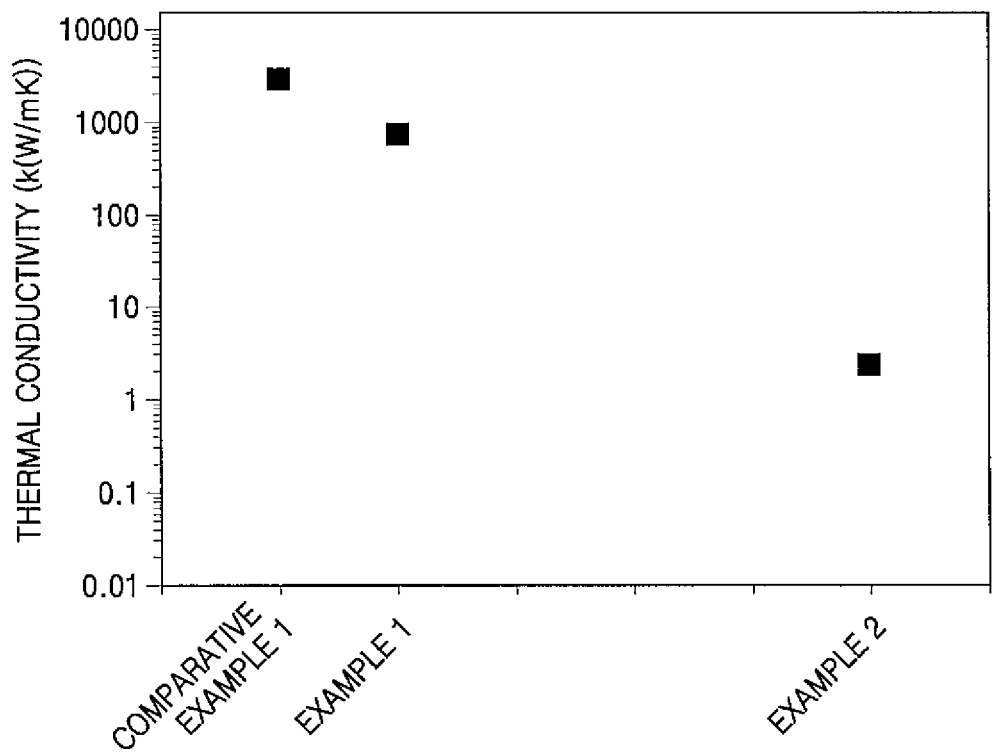
FIG. 8 is a graph illustrating thermal conductivities (k) of thermoelectric materials prepared according to Example 1, Example 2, and Comparative Example 1.

Referring to FIG. 8, it was confirmed that thermal conductivity (k) of the thermoelectric materials prepared according to Examples 1 and 2 was lower than that of the thermoelectric material prepared according to Comparative Example 1.

In addition, thermoelectric properties of the thermoelectric materials prepared according to Example 3 and Comparative Example 2 including electrical conductivity, Seebeck coefficient, and power factor were evaluated. The results are shown in FIGS. 14 to 16, respectively.

The electrical conductivity ($\sigma$) was measured using the conventional 4-point-probe method at 300K, and the Seebeck coefficient (S) was measured using a steady-state method. The power factor, defined as $S^2\sigma$ as shown in Equation 1 above, was calculated by multiplying the electrical conductivity and the square of the Seebeck coefficient.

Figure 14:
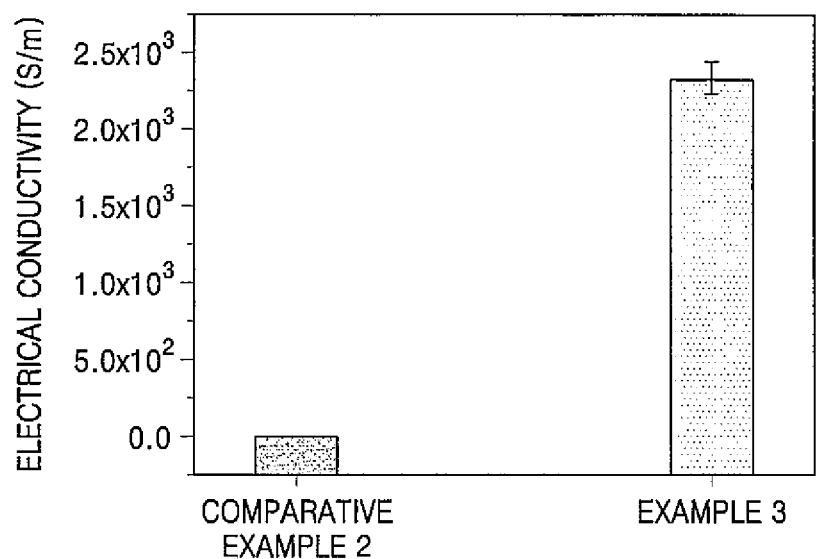
FIG. 14 is a graph illustrating electrical conductivities of thermoelectric materials prepared according to Example 3 and Comparative Example 2.
Figure 15:
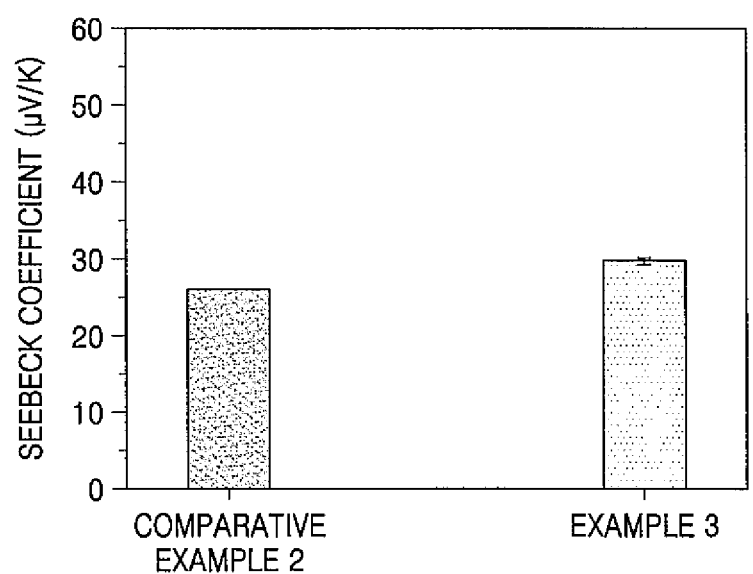
FIG. 15 is a graph illustrating Seebeck coefficients of thermoelectric materials prepared according to Example 3 and Comparative Example 2.
Figure 16:
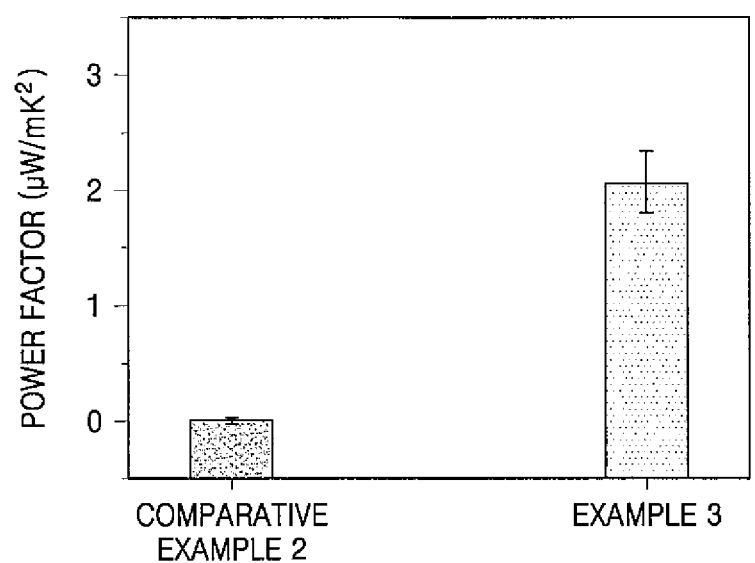
FIG. 16 is a graph illustrating power factors of thermoelectric materials prepared according to Example 3 and Comparative Example 2.

Referring to FIGS. 14 to 16, the thermoelectric material prepared according to Example 3 had an electrical conductivity ($\sigma$) of 2330±107 (S/m), a Seebeck coefficient (S) of 29.8±0.5 ($\mu$V/K), and a power factor ($S^2a$) of 2.06±0.27 ($\mu W/mK^2$). The thermoelectric material prepared according to Comparative Example 2 had an electrical conductivity ($\sigma$) of 0.290±0.115 (S/m), a Seebeck coefficient (S) of 25.9±23.9 ($\mu$V/K), and a power factor ($S^2\sigma$) of 2.34×$10^4$±0.27 ($\mu W/mK^2$).

Therefore, the thermoelectric material prepared according to Example 3 had higher electrical conductivity ($\sigma$) and power factor ($S^2\sigma$) than the thermoelectric material prepared according to Comparative Example 2.

A thermoelectric material according to an embodiment may have excellent thermoelectric properties by using a thermoelectric composite structure including a plurality of pores to decrease thermal conductivity and graphene disposed between the plurality of pores and doped with the nonmetallic element to increase electrical conductivity. In addition, the thermoelectric material may be mass-produced due to reduced manufacturing time and costs.

A thermoelectric material according to another embodiment may also have excellent thermoelectric properties by using a self-standing flexible thermoelectric composite structure including a polymer layer having a glass transition temperature (Tg) of about 50° C. or greater, and a thin film prepared by coating a material having a Seebeck coefficient of ±1 μV/K or greater on one surface of the polymer layer to increase electrical conductivity and decrease thermal conductivity. A thermoelectric device including the thermoelectric material may be applied to apparatuses having various structures.

According to a method of preparing a thermoelectric material, according to another embodiment, current density and thermoelectric efficiency of a thermoelectric module may be increased and the thermoelectric module may be mass-produced.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

The invention claimed is:

1. A thermoelectric material comprising a thermoelectric composite structure comprising:
   a framework of a plurality of graphenes doped with a nonmetallic element; and
   a plurality of pores in the framework of the plurality of graphenes doped with the nonmetallic element, and
   wherein the framework of the plurality of graphenes has 1 to 100 layers.

2. The thermoelectric material of claim 1, wherein the thermoelectric composite structure is a three-dimensional interpenetrating structure.

3. The thermoelectric material of claim 1, wherein the pores are connected to form a channel.

4. The thermoelectric material of claim 1, wherein the doped nonmetallic element comprises at least one element selected from Group XIII elements, Group XIV elements, Group XV elements, and Group XVI elements.

5. The thermoelectric material of claim 1, wherein the doped nonmetallic element comprises at least one element selected from boron (B), nitrogen (N), sulfur (S), and phosphorus (P).

6. The thermoelectric material of claim 1, wherein the nonmetallic element-doped graphenes comprise a p-type or n-type reduced graphene oxide (rGO).

7. The thermoelectric material of claim 1, wherein the thermoelectric composite structure is a product of heat-treatment performed under a reducing atmosphere.

8. A thermoelectric device comprising a thermoelectric material according to claim 1.

9. A method of preparing a thermoelectric material, the method comprising:
   mixing a polymer template solution comprising a nonmetallic element and a graphene solution and dispersing the mixture to prepare a dispersion; and
   preparing the thermoelectric composite structure of claim 1 by filtering and drying the dispersion and heat-treating the dried resultant under a reducing atmosphere.

10. The method of claim 9, wherein the nonmetallic element comprises at least one element selected from Group XIII elements, Group XIV elements, Group XV elements, and Group XVI elements.

11. The method of claim 9, wherein the polymer template solution comprises at least one polymer selected from polystyrene, polyethylene, polypropylene, polyvinyl chloride, polyethylene oxide, a copolymer thereof, or a mixture thereof.

12. The method of claim 9, wherein the graphene solution comprises a graphene oxide solution.

13. The method of claim 9, wherein the reducing atmosphere is an inert gas atmosphere.

14. The method of claim 9, wherein the heat-treatment is performed at a temperature of about 200° C. to about 1500° C.

15. The method of claim 9, wherein the heat-treatment is a two-stage process.

16. The method of claim 9, wherein the preparation of the thermoelectric composite structure comprises forming a plurality of pores by removing a polymer template formed from the polymer template solution, and preparing a thermoelectric composite structure comprising a p-type or n-type rGO doped with a nonmetallic element derived from the polymer template.

17. The method of claim 16, wherein a volume of the p-type or n-type rGO doped with the nonmetallic element is about 5% by volume to about 90% by volume based on a total volume of polymer particles of the polymer template and the rGO.

* * * * *